(12) United States Patent
Na et al.

(10) Patent No.: US 7,847,398 B2
(45) Date of Patent: Dec. 7, 2010

(54) SEMICONDUCTOR DEVICE HAVING A STACKED BUMP TO REDUCE KIRKENDALL VOIDS AND OR CRACKS AND METHOD OF MANUFACTURING

(75) Inventors: Seok Ho Na, Seoul (KR); Jae Yun Kim, Seoul (KR); Yoon Joo Kim, Seoul (KR); Ji Young Chung, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 219 days.

(21) Appl. No.: 11/832,571

(22) Filed: Aug. 1, 2007

(65) Prior Publication Data

US 2009/0032947 A1    Feb. 5, 2009

(51) Int. Cl.
*H01L 23/48* (2006.01)
(52) U.S. Cl. .................. 257/737; 257/738; 257/750; 257/E23.021
(58) Field of Classification Search ................. 257/737, 257/738, 750, E23.021
See application file for complete search history.

(56) References Cited

U.S. PATENT DOCUMENTS

| | | | | |
|---|---|---|---|---|
| 5,735,030 | A * | 4/1998 | Orcutt .......................... | 29/860 |
| 6,564,449 | B1 * | 5/2003 | Tsai et al. ..................... | 29/830 |
| 7,404,513 | B2 | 7/2008 | Kadoguchi et al. | |
| 7,417,324 | B2 * | 8/2008 | Obiya ......................... | 257/780 |
| 7,482,695 | B2 * | 1/2009 | Takyu et al. ................. | 257/777 |
| 2003/0230796 | A1 * | 12/2003 | Ismail et al. ................ | 257/686 |
| 2007/0114664 | A1 * | 5/2007 | Foong ......................... | 257/738 |
| 2007/0279077 | A1 * | 12/2007 | Yabuki et al. ............... | 324/756 |
| 2008/0023831 | A1 * | 1/2008 | Nishimura et al. .......... | 257/737 |

* cited by examiner

*Primary Examiner*—Eugene Lee
(74) *Attorney, Agent, or Firm*—Weiss & Moy, P.C.

(57) ABSTRACT

A semiconductor device has a semiconductor die having at least one bond pad formed on a first surface thereof. A substrate has at least one bond finger formed on a first surface thereof. A second surface of the semiconductor die is attached to the first surface of the substrate. A conductive wire connects the bond pad of the semiconductor die and the bond finger of the substrate wherein at least one end of the conductive wire has a stack bump. An encapsulant is provided to encapsulate the semiconductor die and the conductive wire.

16 Claims, 7 Drawing Sheets

SEMICONDUCTOR DEVICE HAVING A STACKED BUMP TO REDUCE KIRKENDALL VOIDS AND OR CRACKS AND METHOD OF MANUFACTURING

FIELD OF THE INVENTION

This invention relates to semiconductor devices and, more specifically, to a semiconductor device and method of manufacturing which reduces kirkendall voids or cracks between a bond pad and a conductive wire.

BACKGROUND OF THE INVENTION

A semiconductor device generally includes a circuit board or a lead frame (hereinafter circuit board). A semiconductor die is generally mounted to and electrically connected to the circuit board. The connection between the semiconductor die and the circuit board is performed by a connecting member such as conductive wire to bond pads on the semiconductor die and the circuit board.

The conductive wire is widely used in many kinds of semiconductor devices as it has good workability and provides good signal transmitting performance. The conductive wire used in the semiconductor device is generally fabricated using high-purity metals so as to maintain the moldability and electrical transmitting properties.

However, using high-purity wire materials do have certain drawbacks that may reduce reliability of the semiconductor device using the conductive wire. One of the issues is that the conductive wire forms an intermetallic compound (IMC) with the bond pad. IMCs are chemical compounds formed by two metallic chemical elements. The resulting compounds are chemically different from either of the two constituents. The IMC formed by the conductive wire and the bond pad results in kirkendall voids or cracks between the bond pad and the conductive wire. Kirkendall voids or cracks are formed by bonding different pure metals that have different interdiffusion coefficients. The voids/cracks cause the electric conductivity of the conductive wire to drops. Furthermore, the voids/cracks could cause the conductive wire to break. These problems are main factors reducing the reliability and the production yield of the semiconductor device.

Therefore, a need existed to provide a device and method to overcome the above problems.

SUMMARY OF THE INVENTION

A semiconductor device has a semiconductor die having at least one bond pad formed on a first surface thereof. A substrate has at least one bond finger formed on a first surface thereof. A second surface of the semiconductor die is attached to the first surface of the substrate. A conductive wire connects the bond pad of the semiconductor die and the bond finger of the substrate wherein at least one end of the conductive wire has a stack bump. An encapsulant is provided to encapsulate the semiconductor die and the conductive wire.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
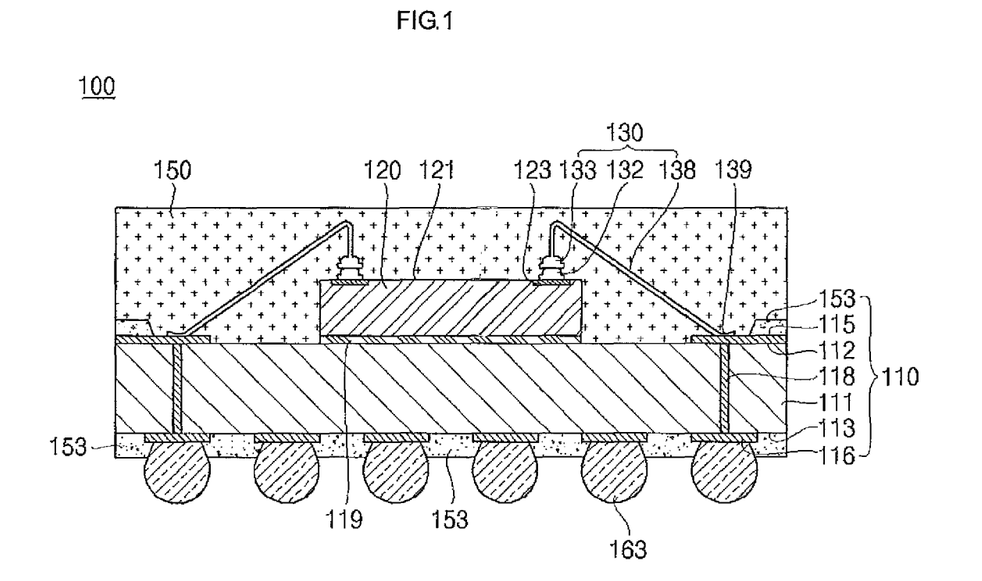
FIG. 1 is a cross-sectional view of a semiconductor package according to one embodiment of the present invention.

Referring to FIG. 1, a cross-sectional view of a semiconductor device 100 according to one embodiment of the present invention is shown. The semiconductor device 100 includes a substrate 110, a semiconductor die 120, a bump 132, a conductive wire 138 having ball bond 133 and stitch bond 139, an encapsulant 150 and a solder ball 163.

The substrate 110 includes an insulator 111, a bond finger 115, a ball land 116, a conductive via 118 and a solder mask 153. The semiconductor die 120 is coupled to the substrate 110 by an adhesive member 119. The bond finger 115 is formed on a first surface 112, which is an upper surface of the insulator 111, and the bond finger 115 is electrically connected to the semiconductor die 120 through the bump 132 and conductive wire 138. Further, the bond finger 115 is electrically connected to the ball land 116 by the conductive via 118 which passes through the first and second surfaces 112, 113 of the substrate 110. This substrate 110 may be formed of a one layer insulator as described in FIG. 1. Alternatively, the substrate 110 may be formed by stacking a multitude of layers. The above are given as examples and the present invention is not restricted thereto. The adhesive member 119 may be a paste adhesive, a double sided adhesive tape and the equivalent thereof, however the present invention is not restricted thereto. As described in FIG. 1, a part of the ball land 116 and the second surface 113 of the substrate 110 may be encapsulated by the solder mask 153, and the solder mask 153 may be formed to cover a part of the bond finger 115. However, the present invention is not restricted thereby.

The semiconductor die 120 is fixed to the first surface 112 of the substrate 110 by the adhesive member 119. The semiconductor die 120 is further electrically connected with the bond finger 115 formed on the first surface 112 of the substrate 110. The bump 132 and conductive wire 138 is used to electrically connect the semiconductor die 120 to the bond finger 115. In order to electrically connect the semiconductor die 120, at least one bond pad 123 is formed on a first surface 121 of the semiconductor die 120. The bond pad 123 may be formed of a material selected from the group consisting of Al and the equivalent metal, or an alloy thereof, however the present invention is not restricted thereto.

The bump 132 is formed on the bond pad 123 and the conductive wire 138 electrically connects the bump 132 and the bond finger 115. In the embodiment shown, the conductive wire 138 includes ball bond 133, which is stacked on the bump 132. In an alternative embodiment, it is possible to stack additional bumps on the bump 132 and the present invention is not restricted thereto. The ball bond 133 is formed at one end of the conductive wire 138 in FIG. 1, the ball bond 133 may be formed at both ends of the conductive wire 138, and the present invention is not restricted thereby. The bump 132 is formed on the bond pad 123 and is electrically connected to the bond pad 123. A ball bond 133 of the conductive wire 138 is electrically connected to the bump 132. The conductive wire 138 extended from the ball bond 133 portion and is connected to the bond finger 115. Particularly, the bump 132 and the conductive wire 138 may be made of same metal of different purity, same metal of similar purity, or different metals. This will be explained more precisely with reference to FIG. 3 and the following drawings. Also, when the ball bond 133 of the conductive wire 138 is staked on the bump 132 at one end of the conductive wire 138, the other end of the conductive wire 138 is connected by using a stitch bond 139. However, the present invention is not restricted thereto.

An encapsulant 150 is used to encapsulates the substrate 110, the semiconductor die 120, the bump 132 and the conductive wire 138. The encapsulant 150 prevents foreign substances such as moisture and air from infiltrating into the substrate 110, the semiconductor die 120, the bump 132 and the conductive wire 138. The encapsulant 150 further protects them against external forces and secures electrical insulation. Thus, the encapsulant 150 has mechanical strength and electrical insulation. The encapsulant 150 may further have dissipation property for dissipating heat from the semiconductor die 120. The above are some of the benefits of the encapsulant 150. However, the present invention is not restricted thereto Solder balls 163 are attached to one surface of the ball lands 116 and provide a conductive path between the semiconductor package 100 and an external circuit. The solder balls 163 may be spherical shape as described in FIG. 1. However, the present invention is not restricted thereto. The solder balls 163 may be made of Ag, Pb, Sn, leadless Sn and the equivalent metal or the equivalent alloy thereof. However, the present invention is not restricted thereto.

Figure 2:
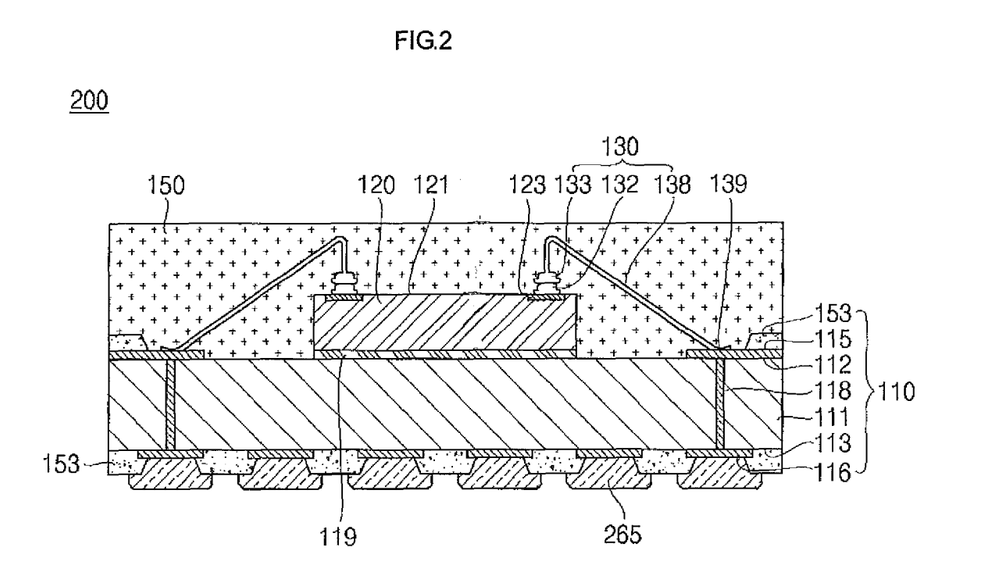
FIG. 2 is a cross-sectional view of a semiconductor package according to another embodiment of the present invention.

Referring now to FIG. 2, a cross-sectional view illustrating a semiconductor device 200 according to another embodiment of the present invention is shown. The semiconductor package 200 includes a substrate 110, semiconductor die 120, a bump 132, a conductive wire 138, an encapsulant 150 and a solder 265. The embodiment described in FIG. 2 is similar in construction with the embodiment of FIG. 1. Therefore, the difference between FIG. 1 and FIG. 2 will be described.

The solder 265 is attached to one surface of the ball land 116 and provides a conductive path between an external circuit and the semiconductor package 200. As illustrated in FIG. 2, the solder 265 may be used by shaping it, however the present invention is not restricted thereto. The solder 265 may be made of Ag, Pb, Sn, leadless Sn and the equivalent metal or the alloy thereof by mixing them in the Flux and forming them, however the present invention is not restricted thereto.

Figure 3:
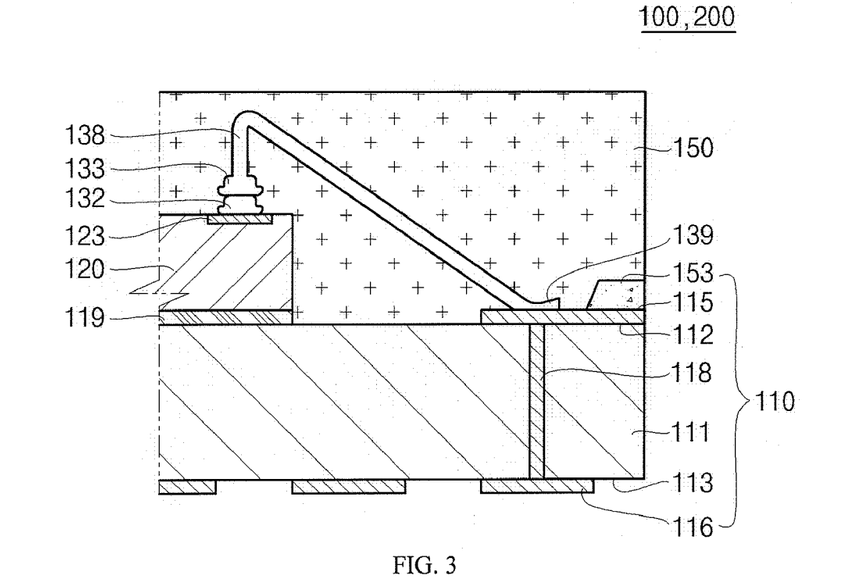
FIG. 3 is a magnified view illustrating a conductive wire of FIG. 1 and the connection of the conductive wire to the semiconductor die.

Referring to FIG. 3, a detailed view illustrating a bump 132 and a conductive wire 138 of FIG. 1 and the connecting construction of the bump 132 and the conductive wire 138 is shown. FIG. 3 illustrates an embodiment that one end of the conductive wire 138 is ball bond 133 and the other end is stitch bond 139.

As shown in FIG. 3, the semiconductor die 120 may be fixed on the substrate 110 by the adhesive member 119 as described above. At least one bond pad 123 is formed on the semiconductor die 120, and a bump 132 is formed on the bond pad 123. A ball bond 133 of the conductive wire 138 is connected to the bump 132 and the other end of the conductive wire 138 is stitch bond 139, which is connected to a bond finger 115 of a substrate 110.

The bump 132 according to one embodiment of the present invention is made of a metal, which is different from the metal of the bond pad 123. That is, the bond pad 123 may be formed by using Al and the equivalent metal or the alloy thereof, and the conductive wire 138 may be formed by using Au, Cu and the equivalent metal thereof. The bump 132 may be made by using a metal, which has relatively low purity compared to that of the conductive wire 138. Thus, the bump 132 and the conductive wire 138 may be formed with the same metal having different impurities. The bump 132 may be formed with different metal from that of the conductive wire 138.

The bump 132 and the conductive wire 138 may be made by using Au. Here, the bump 132 is made of Au (approximately 99% to 99.9% purity), and the conductive wire 138 are made of Au (approximately 99.9% and above purity). In an alternative embodiment, the bump 132 and the conductive wire 138 may be made by using Cu. Here, the bump 132 is made of Cu (approximately 99% to 99.9% purity), and the conductive wire 138 is made of Cu (approximately 99.9% and above purity)

However an impurity may be added to improve the property of the bump 132 and the conductive wire 138. For example, the impurity Ca and Be may be added. However, the present invention is not restricted thereto.

According to one embodiment of the present invention, the property of the bump 132 and the conductive wire 138 are adjusted as the bond pad 123 is made of Al, and the impurity Ca and Be. For example, the generation of the intermetallic compound, crack and void is minimized when Ca or Be of 10 to 30 ppm is added to Au in case of the bump 132 and Ca or Be of 5 ppm or below is added to Au in case of the conductive wire 138.

Alternatively, the bump 132 and the conductive wire 138 may be made of Au, but the impurity included in Au for the bump 132 and the impurity included in Au for the conductive wire 138 are different from each other. For example, the bump 132 is made of Au (approximately 99% and above purity) including Be as an impurity, and the conductive wire 138 is made of Au (approximately 99% and above purity) including Ca as an impurity. Here, the electrical property of the bump 132 and the conductive wire 138 are excellent when the main metal has the purity of approximately 99% and above. The above is given as an example and the present invention is not restricted thereby. The impurities may be Be, La, Y, Ca, Pd, Ce, Mg, Cu, Fe and the equivalent thereof. However, again, the present invention is not restricted thereto. Particularly, the electrical/mechanical property and moldability of the bump 132 and the conductive wire 138 are excellent, in case that one of Be, La and Y is added into Au consisting of the bump 132 and that one of Ca, Pd, Ce, Mg, Cu and Fe is added into Au consisting of the conductive wire 138. However, the present invention is not restricted thereto. In accordance with one embodiment, the desired property is obtained when the amount of the impurity to be added is approximately: Be 20 ppm and below, La 60 ppm and below, Y 40 ppm and below, Ca 40 ppm and below, Pd 1.3% and below, Ce 30 ppm and below, Mg 30 ppm and below, Cu 400 ppm and below, and Fe 20 ppm and below. However, the present invention is not restricted thereto.

Unlike above, the bump 132, the conductive wire 138 may be formed of different metals. In accordance with one embodiment, the bump 132 is made of Au (approximately 99% to 99.9% purity) and the conductive wire 138 are made of Cu. Here, Cu may have the purity of approximately 99% and above to maintain the electrical property, however the present invention is not restricted thereto. It is preferable that the metal used for forming the bump 132 is a softer metal than that of the conductive wire 138 when the bump 132 and the conductive wire 138 are made of different metals.

The generation of the intermetallic compound can be prevented or restrained as well as excellent electrical property and good moldability can be obtained in case of using the bump 132 and the conductive wire 138, which are made of different metals or the same metal having different impurities. These properties can be obtained, when the bump 132 compensates the purity difference between the metal material for forming the conductive wire 138 and the metal material of the bond pad 123 and serves as a buffer layer, and the electrical property is maintained by the conductive wire 138.

The intermetallic compound is formed at junction region between metals when different metals of high purity are connected to each other. As the purity is high, the generation of the intermetallic compound is increased, and therefore the generations of the crack and the void are increased. The mechanical strength and the electrical property of the bump 132 and the conductive wire 138 are reduced, since the crack and the void at the junction region are formed when the intermetallic compound is formed. Therefore, if the purity of one metal to be connected is lowered, then the generation velocity and the amount of the intermetallic compound are deteriorated.

However, there is a problem that the molding property and the electrical property are deteriorated when the bump 132 and the conductive wire 138 are made of low-purity metal. Therefore, for resolving this problem, according to one embodiment of the present invention, the bump 132 is made of low-purity metal, and the conductive wire 138 are made of high-purity metal.

This effect is expected when the impurity to be added is different. That is, the impurity minimizing the generation of the intermetallic compound is added to the metal forming the bump 132, and the impurity maintaining the electrical property and moldability is added into the conductive wire 138. Thus, the desired electrical property is obtained and the generation of the intermetallic compound is restrained. That is, although the generation of the intermetallic compound is minimized mostly when Be, Y, and La of the impurities are added into Au, the generation of the intermetallic compound is also minimized when other impurities are added. However, the excellent electrical property is maintained when the bump 132 is formed by adding one of Be, Y and La into Au and the conductive wire 138 is formed by adding one of Ca, Pd, Ce, Mg, Cu and Fe into Au.

Meanwhile, the conventional conductive wire is only made of Au. This is because the ductility and the electrical property of other metals are generally not sufficient enough. For example, when the conductive wire is made of Cu, there is a problem that the breakages of the semiconductor die 120 or the bond pad 123, or the scratch occurs due to the hardness of Cu. Therefore, according to the present invention, this problem is solved in that the bump 132 is made of Au, which is softer than Cu, and that the conductive wire 138 are made of Cu. Thus, the bump 132 made of Au, which is relatively ductile, is attached on the bond pad 123 to protect the bond pad 123 and the semiconductor die 120, and the conductive wire 138 are made of Cu.

When the ball bond 133 of the conductive wire 138 is staked on the bump 132, the generation of the intermetallic compound is considerably reduced and the generation velocity of the intermetallic compound is low even when it is formed, and the intermetallic compound layer is confined into a very small region. Also, it is possible to form the bump 132 and the conductive wire 138 without the damage of the bond pad 123 and the semiconductor die 120 even if the hard metal such as Cu is used.

Figure 4:
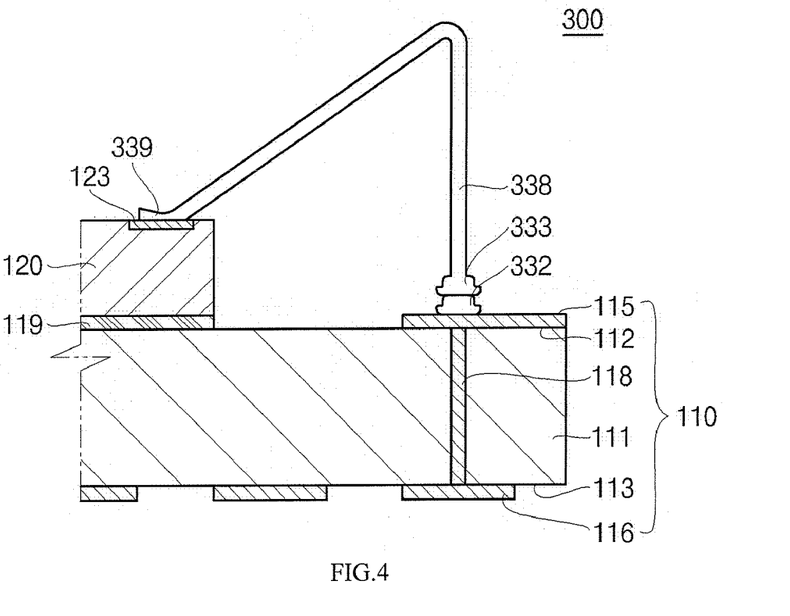
FIG. 4 is a magnified view illustrating one embodiment of how a stack bump is developed on a bond finger.
Figure 5:
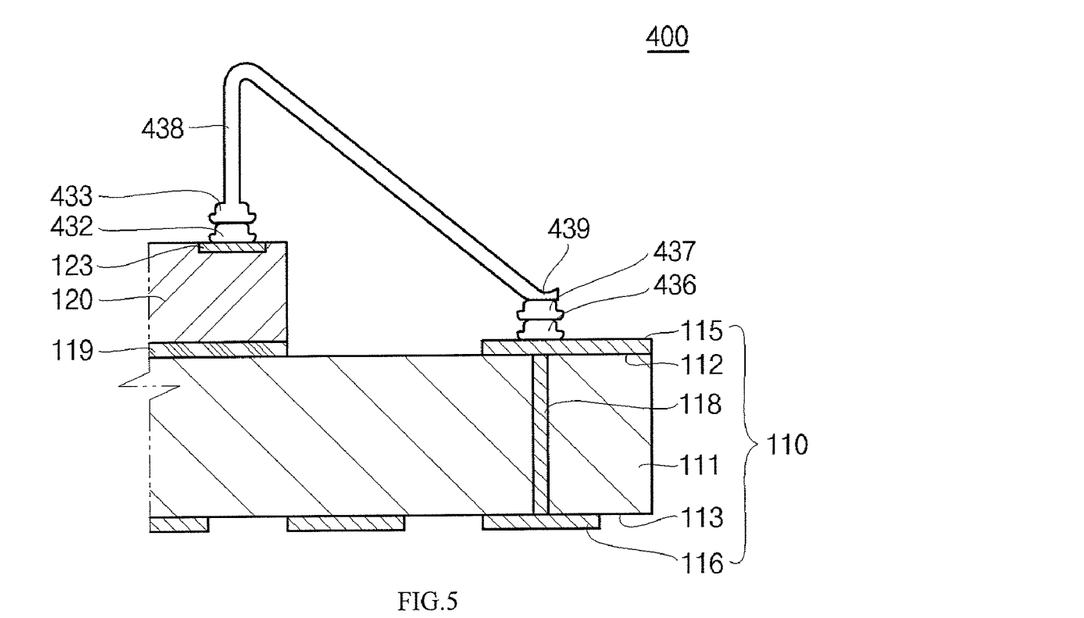
FIG. 5 is a magnified view illustrating one embodiment of how a stack bump is developed on both a bond finger and a bond pad.
Figure 6:
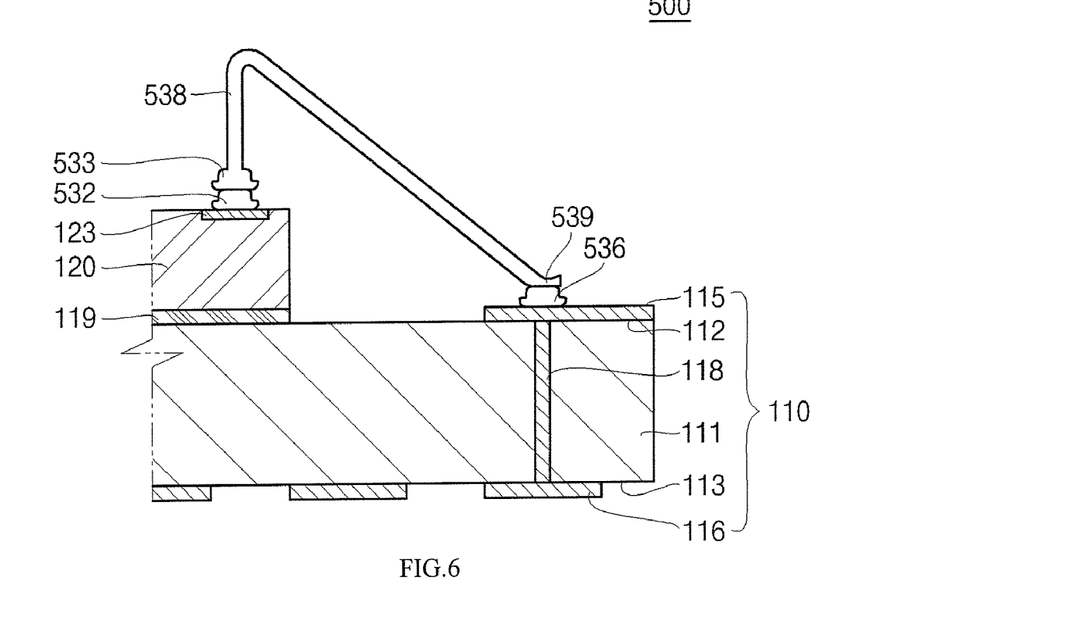
FIG. 6 is a magnified view illustrating one embodiment showing a conductive wire composed of a stack bump and single bump.

FIGS. 4 to 6 are views partially illustrating other embodiments of the present invention. FIG. 4 illustrates an embodiment where a bump is developed on a bond finger. FIG. 5 illustrates another embodiment where a bump is developed on a bond pad and two bumps are developed on a bond finger. FIG. 6 shows an embodiment where a bump is developed on a bond pad and a bond finger.

As illustrated in FIG. 4, in the bump 332 is formed on the bond finger 115 and the ball bond 333 of the conductive wire 338 is connected to the bump 332. The stitch bond 339 of the conductive wire 338 is connected to the bond pad 123 of the semiconductor die 120. The bump 332 has lower purity than the conductive wire 338, or the bump 332 is made of materials different from that of the conductive wire 338. That is, the bump 332 is made of Au (approximately 99% to 99.9% purity), and the conductive wire 338 is made of Au (approximately 99.9% and above purity). Also, the bump 332 is made of Au (approximately 99% to 99.9% purity), and the conductive wire 338 is made of Cu. Furthermore, the bump 332 and the conductive wire 338 are made of Au (approximately 99% to 99.9% purity), wherein the impurity added in the Au of the bump 332 and the impurity added in Au of the conductive wire 338 are different to each other.

According to this embodiment, the ball bond 333 of the conductive wire 338 is formed on the bump 332 after forming the bump 332 on the bond finger 115. The stitch bond 339 of the conductive wire 338 is connected to the bond pad 123 of the semiconductor die 120.

FIG. 5 illustrates an example of an embodiment where bumps 432, 436, 437 are developed on the bond pad 123 and the bond finger 115. That is, the embodiment described in FIG. 5 illustrates that the bumps 432, 436, 437 are connected both ends of the conductive wire 438. Particularly, the bump 437 is stacked on the bump 436, which is formed on the bond finger 115. The conductive wire 438 according to FIG. 5 includes a ball bond 433 formed on the bump 432 and a stitch bond 439 formed on the bump 437.

The bump 432 formed on the bond pad 123 and the bump 436 formed on the bond finger 115 may be made of the same metal, and the metal of the bumps 432, 436 may be different from that of the conductive wire 438. Alternatively, the metal may have lower purity than that of the conductive wire 438, or the metal may be the same metal as the conductive wire 438 except that the impurity added into the metal is different from them. Here, the bumps 432, 436 do not need to be made of the same metal, and the conductive wire 438 and the bump 437 also do not need to be made of the same metal.

The bumps 432, 436 are formed respectively on the bond pad 123 and the bond finger 115. The bump 437 is formed on the bump 436, which is formed on the bond finger 115. After that, the ball bond 433 of the conductive wire 438 is connected to the bump 432 and the stitch bond 429 of the conductive wire 438 is connected to the bump 437, thereby electrically connecting the semiconductor die 120 and the substrate 110.

According to the embodiment described in FIG. 5, the bumps 432, 436, 437 are formed on both the conductive pad 123 and bond finger 115. The bump 437 formed on the bump 436 is not inevitably needed. That is, the bump 437 can be omitted. The embodiment omitting the bump 437 is illustrated in FIG. 6.

Referring to FIG. 6, the bump 532 is formed on the bond pad 123 and single bump 536 is formed on the bond finger 115. It is also possible that the single bump is formed on the bond pad 123 and the stack bump is formed on the bond finger 115, however the present invention is not restricted thereto.

Figure 7A:
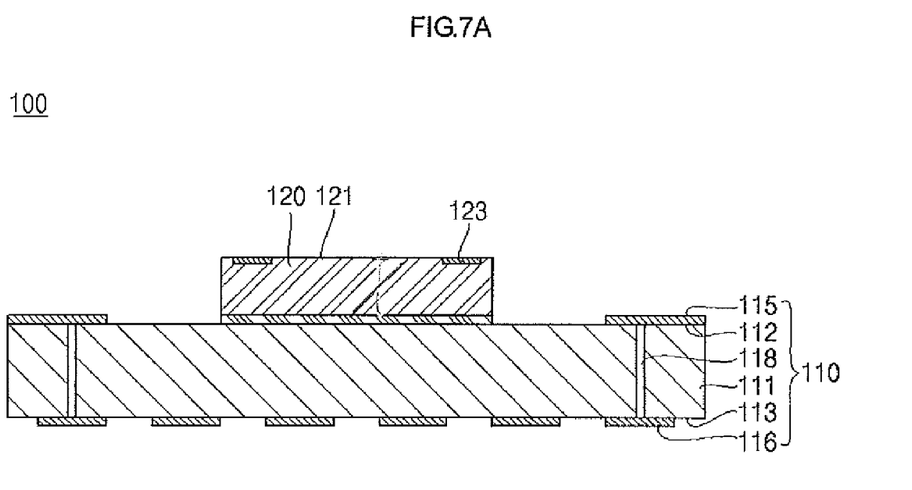
FIG. 7A is a cross sectional view showing a step of preparing a semiconductor die and a substrate for the semiconductor device of FIGS. 1 and 2.

FIGS. 7A to 7E illustrate fabricating processes for the semiconductor packages described in FIGS. 1 and 2. Referring to FIG. 7A, the substrate 110 and the semiconductor die 120 are prepared in advance. Here, the bond finger 115, the ball land 116 and the conductive via 118 are formed on the substrate 110. At least one bond pad 123 is formed on the semiconductor die 120. The semiconductor die 120 is attached to the first surface 112 of the substrate 110 by the adhesive member 119.

Figure 7B:
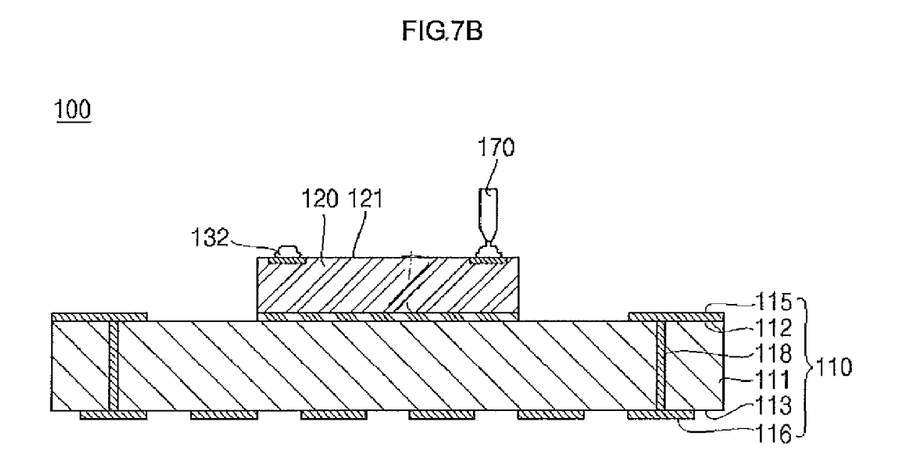
FIG. 7B is a cross sectional view showing a step of forming a bump for the semiconductor device of FIGS. 1 and 2.

As illustrated in FIG. 7B, the bump 132 is formed on the bond pad 123 of the semiconductor die 120 by a first capillary 170. For this end, the material metal of the bump 132, which is a low-purity metal or a metal in which a kind of impurity is added, is supplied to the first capillary 170. In accordance with one embodiment of the present invention, Au of approximately 99% to 99.9% purity is supplied to the first capillary 170.

Figure 7C:
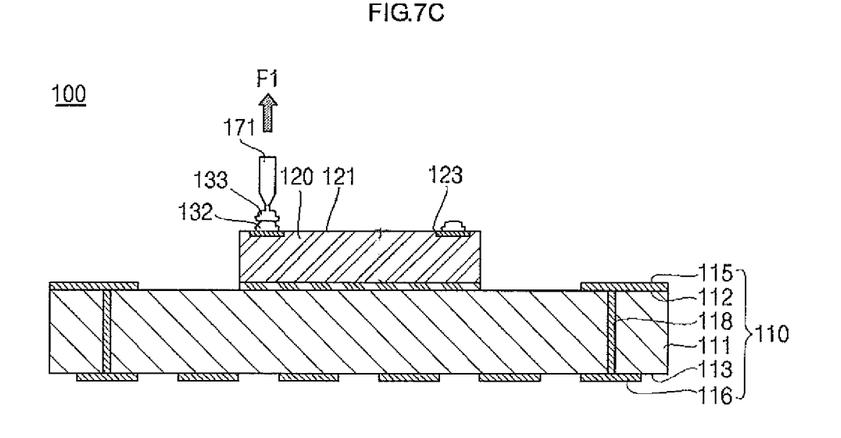
FIG. 7C is a cross sectional view showing a step of forming a ball bond for the semiconductor device of FIGS. 1 and 2.

Next, as illustrated in FIG. 7C, a second capillary 171 forms a ball bond 133 on the bump 132. The second capillary 171 is arranged on the bump 132 and the material metal of the ball bond 133 is melt and supplied onto the bump 132 thus forming the ball bond 133. Even when the formation of the ball bond 133 is completed, the second capillary 171 does not stop the supply of the material metal but moves in the vertical direction F1. Therefore, the conductive wire 138 is formed. Here, high-purity Au or Cu, or the metal added with other impurities is supplied to the second capillary 171, however the present invention is not restricted thereto.

Figure 7D:
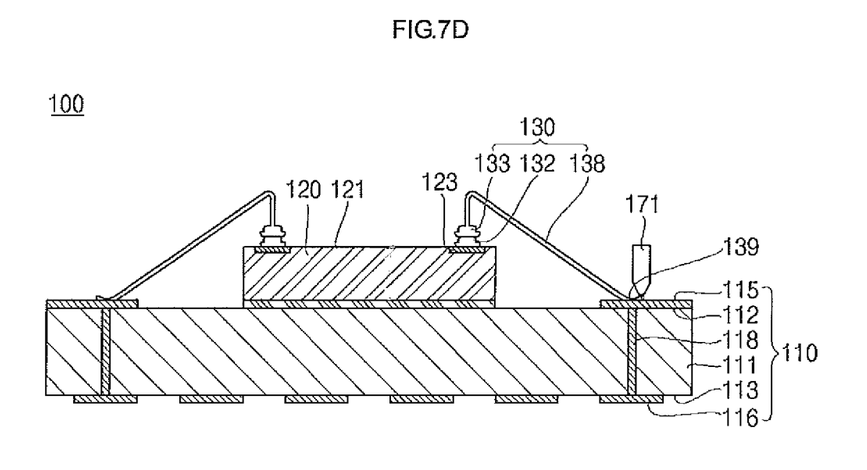
FIG. 7D is a cross sectional view showing a step of forming of forming a wire for the semiconductor device of FIGS. 1 and 2.
Figure 7E:
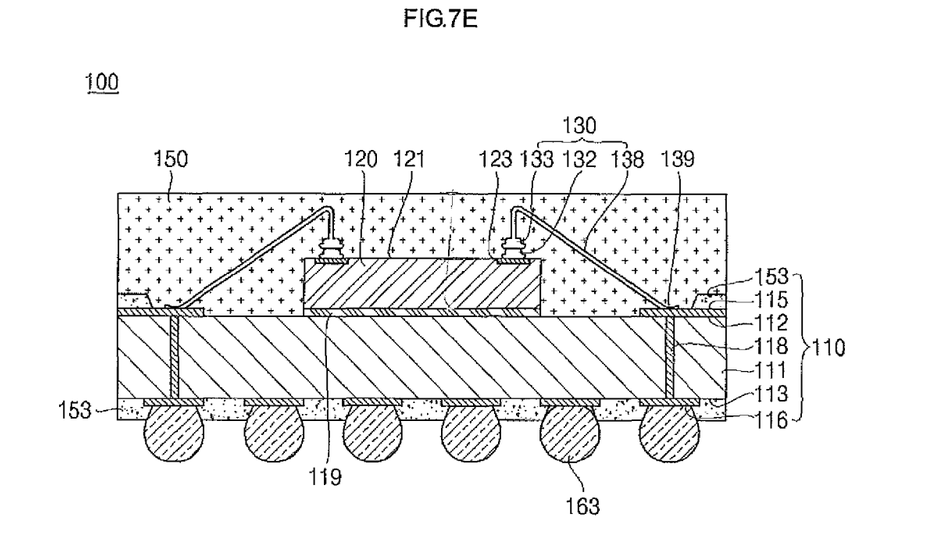
FIG. 7E is a cross sectional view showing the shape of the semiconductor device formed by the steps shown in FIGS. 7A-7D.

The second capillary 171 moves into the bond finger 115 after moving in the vertical direction F1, and therefore the conductive wire 138 along the moving path of the second capillary 171 is formed. Further, the second capillary 171 is detached from the bond finger 115 after forming the conductive wire 138 by connecting the stitch bond 139 of the conductive wire 138 to the bond finger 115. The conductive wire 138, connecting the bump 132 and the bond finger 115 respectively, is formed by iterating this step.

Further, the semiconductor device 100 is completed, as part of the semiconductor die 120, the bump 132, the conductive wire 138 and the substrate 110 are encapsulated by the encapsulant 150. Solder balls 163 are attached to the ball land 116. Here, the solder ball 163 is attached thereto in FIG. 7E, but it is possible to attach the solder 265 to the ball land 116 as described in FIG. 2, and the present invention is not restricted by the accompanying drawings. One semiconductor device 100 is formed individually according to FIGS. 7A to 7E, however it is possible to form a multitude of semiconductor packages simultaneously and they are divided into the respective semiconductor device 100 by the singulation process after the package process is done.

The semiconductor package 300 described in FIG. 4 has similar configuration as one in FIG. 3 except that the bump 332 and ball bond 333 of the conductive wire 338 are formed on the bond finger 115, and therefore it is possible to modify the process procedure in FIGS. 7A-7E. Therefore, the process forming the semiconductor package 300 described in FIG. 4 will be omitted.

Figure 8A:
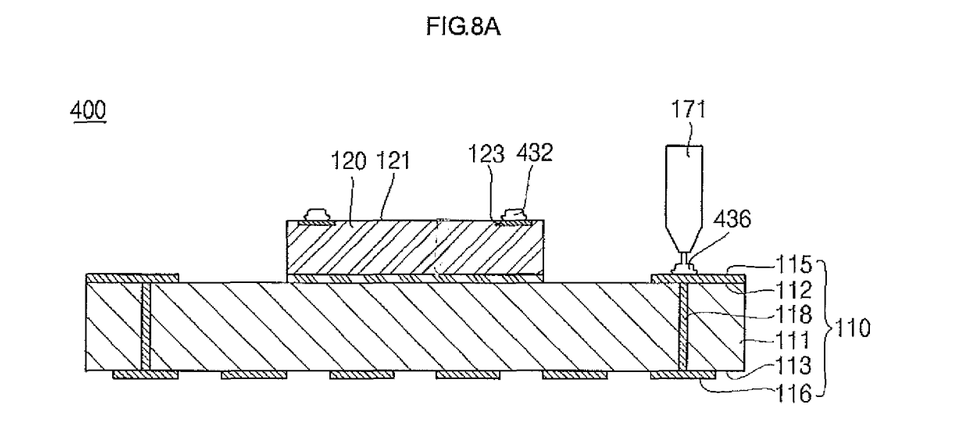
FIG. 8A is a cross sectional view showing a step of preparing a substrate and forming a bump for forming the wire depicted in FIG. 5.
Figure 8B:
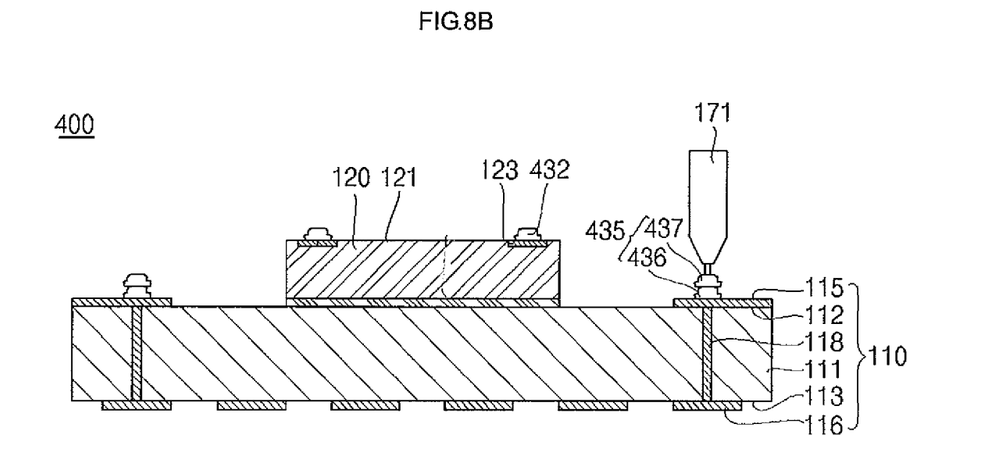
FIG. 8B is a cross sectional view showing a step of forming a second stack bump for forming the wire depicted in FIG. 5.
Figure 8C:
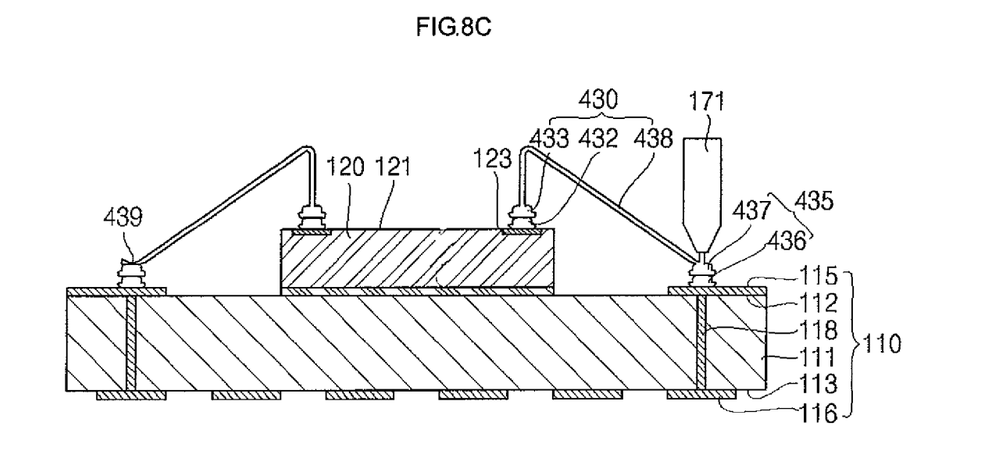
FIG. 8C is a cross sectional view showing a step of forming a ball bond of a first stack bump and a wire depicted in FIG. 5.

FIGS. 8A and 8C are process views illustrating a forming method of the conductive wire in FIG. 5. Referring to FIGS. 8A and 8C, the bumps 432, 436 in FIG. 8A are formed on the bond pad 123 and the bond finger 115 by the first capillary 170, after the substrate 110 and the semiconductor die 120 are prepared as illustrated in FIG. 7A.

After that, the bump 437 is stacked on the bump 436. In FIG. 8B, the bump 437 is previously formed, however it is possible to form the ball bond 433 of the conductive wire 438, and thus the present invention is not restricted thereby. Here, while the second capillary 171 does not form the conductive wire 438 but forms the bump 437, it moves onto the conductive pad 123 and is arranged thereto.

The ball bond 433 of the conductive wire 438 is formed on the bump 432 as illustrated on FIG. 8C. Here, the second capillary 171 forms the conductive wire 438 with the formation of the ball bond 433. The formation of the ball bond 433 is completed as illustrated in FIGS. 7C and 7D, the conductive wire 438 is formed by being moved into the direction of the bond finger 115 without stopping the supply of the metal material after that the second capillary 171 moves in the vertical direction.

Therefore, the conductive wire 438 is formed as the second capillary 171 connects the end of the wire 438 on the bump 437 and separates therefrom. A multitude of conductive wires 438 are formed by iterating this process. After that, the manufacture of the semiconductor package is accomplished through the steps of: encapsulation, the solder ball or solder attachment, and singulation.

Here, the configuration of the semiconductor package 500 and the conductive wire 538 described in FIG. 6 may be embodied by omitting the step for forming the bump 437 which is stacked on the bump 436. Therefore, the detailed-explanation about the separate process for forming the semiconductor package 500 and the conductive wire 538 will be omitted.

As described above, it is possible to prevent the generation of the intermetallic compound due to the contact between the bond pad and the conductive wire by supplying the conductive wire in which at least one end of the conductive wire has the stacked wire of at least two stages. Furthermore, by using the bump, it is possible to form the conductive wire without the damage to the semiconductor die, the bond pad and the bond finger even if the hard metal, which is harder than Au, is used.

The drawings and the constitutional elements are not illustrated to the proper scale, emphasis instead being placed upon illustrating principles of the invention. However, those skilled in the art will appreciate them with ease.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
a semiconductor die having at least one bond pad formed on a first surface thereof;
a substrate having at least one bond finger formed on a first surface thereof, a second surface of the semiconductor die attached to the first surface of the substrate;
a bump formed on the at least one bond pad, wherein impurities are added to the bump;
a conductive wire connecting the bond pad of the semiconductor die and the bond finger of the substrate, the conductive wire having a ball bond formed on a first end, the ball bond attached to the bump;
an impurity added in different concentrations to the bump and the conductive wire, wherein the bump and the conductive wire are formed from a same metal and having different purities, the conductive wire being of a higher purity than the bump; and
an encapsulant encapsulating the semiconductor die and the conductive wire.

2. A semiconductor device in accordance with claim 1, further comprising a stitch bond attaching a second end of the conductive wire to the at least one bond finger.

3. A semiconductor device in accordance with claim 1, wherein the conductive wire is of a higher purity than the bump to reduce an intermetallic compound (IMC) that results in kirkendall void or crack between the bond pad and the conductive wire.

4. A semiconductor device in accordance with claim 3, wherein at least one of the bump and the conductive wire includes one of Ca and Be.

5. A semiconductor device in accordance with claim 1, wherein the impurity may be one selected from the group consisting of Ca, Be, Ce, Pd, Mg, La, Y, Cu, Fe, or combinations thereof.

6. A semiconductor device in accordance with claim 2, wherein the bump is made of Au and at least one of Be, La, Y, or combinations thereof is added to the bump as an impurity, and
the conductive wire are made of Au and at least one of Ca, Ce, Pd, Mg, Cu, Fe, and combinations thereof is added to them as an impurity.

7. A semiconductor device in accordance with claim 2, wherein the bump and the ball bond of the stacked bump are made of different metals.

8. A semiconductor device in accordance with claim 2, wherein the bump is made of Au and the ball bond is made of Cu in the stack bump.

9. A semiconductor device in accordance with claim 2, wherein at least one of the bond pad and the bond finger is ball-bonded with the bump.

10. A semiconductor device in accordance with claim 9, wherein at least one of the bond pad and the bond finger is stitch-bonded with the conductive wire.

11. A semiconductor device comprising:
a semiconductor die having at least one bond pad formed on a first surface thereof;
a substrate having at least one bond finger formed on a first surface thereof, a second surface of the semiconductor die attached to the first surface of the substrate;
a conductive wire connecting the bond pad of the semiconductor die and the bond finger of the substrate;
means coupled to at least one end of the conductive wire to reduce an intermetallic compound (IMC) that results in kirkendall void or crack between a bond pad and the conductive wire; and
an encapsulant encapsulating the semiconductor die and the conductive wire;
an impurity added in different concentrations to the means and the conductive wire, wherein the means and the conductive wire is formed from a same metal having different purities, the conductive wire being of a higher purity.

12. A semiconductor device in accordance with claim 11, wherein the means comprises a stack bump having a bump and a ball bond stacked on the bump and connected to the conductive wire, wherein the bump is formed of a metal different from that of the bond pad.

13. A semiconductor device in accordance with claim 12, wherein the conductive wire having a higher purity than the bump to reduce an intermetallic compound (IMC) that results in kirkendall void or crack between the bond pad and the conductive wire.

14. A semiconductor device comprising:
a semiconductor die having at least one bond pad formed on a first surface thereof;
a substrate having at least one bond finger formed on a first surface thereof, a second surface of the semiconductor die attached to the first surface of the substrate;
a conductive wire connecting the bond pad of the semiconductor die and the bond finger of the substrate wherein at least one end of the conductive wire has a stack bump having a bump and a ball bond stacked on the bump and connected to the conductive wire, wherein the bump is formed of a metal different from that of the bond pad; and
an impurity added in different concentrations to the bump and the conductive wire, wherein the bump and the conductive wire are formed from a same metal, the conductive wire being of a higher purity than the bump due to the impurity added;
an encapsulant encapsulating the semiconductor die and the conductive wire.

15. A semiconductor device in accordance with claim 14, wherein the bump and the conductive wire is formed from a same metal having different purity.

16. A semiconductor device in accordance with claim 14, wherein at least one of the bump and the conductive wire is made of the same metal, wherein impurities added to the at least one of the bump and the conductive wire are different to each other to minimize an intermetallic compound (IMC) that results in kirkendall void or crack between the bond pad and the conductive wire.

* * * * *